United States Patent
Roh

(10) Patent No.: US 8,519,522 B2
(45) Date of Patent: Aug. 27, 2013

(54) SEMICONDUCTOR PACKAGE

(75) Inventor: Hee Ra Roh, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 9 days.

(21) Appl. No.: 13/271,299

(22) Filed: Oct. 12, 2011

(65) Prior Publication Data

US 2012/0091562 A1 Apr. 19, 2012

(30) Foreign Application Priority Data

Oct. 15, 2010 (KR) .................. 10-2010-0100740
Sep. 23, 2011 (KR) .................. 10-2011-0096144

(51) Int. Cl.
| | |
|---|---|
| H01L 23/02 | (2006.01) |
| H01L 23/34 | (2006.01) |
| H01L 23/48 | (2006.01) |
| H01L 23/52 | (2006.01) |
| H01L 29/40 | (2006.01) |
| H01L 21/00 | (2006.01) |
| H01L 21/44 | (2006.01) |

(52) U.S. Cl.
USPC .......... 257/678; 257/723; 257/737; 438/106; 438/613

(58) Field of Classification Search
USPC ................ 257/618, 622, 678, 723–727, 737, 257/738, 739, 773; 438/106, 613, 618
See application file for complete search history.

(56) References Cited

U.S. PATENT DOCUMENTS

| | | | |
|---|---|---|---|
| 5,814,885 A * | 9/1998 | Pogge et al. | 257/730 |
| 2007/0228502 A1* | 10/2007 | Minamio et al. | 257/431 |
| 2008/0251944 A1* | 10/2008 | Oi | 257/778 |
| 2009/0026600 A1* | 1/2009 | Koon et al. | 257/686 |

* cited by examiner

*Primary Examiner* — Fernando L Toledo
*Assistant Examiner* — Aaron Gray
(74) *Attorney, Agent, or Firm* — William Park & Associates Patent Ltd.

(57) ABSTRACT

A semiconductor package includes a substrate having an upper surface and a lower surface which faces away from the upper surface, and possessing a recess which is defined on the upper surface; and a semiconductor chip mounted to the upper surface of the substrate, having one surface which faces the upper surface and the other surface which faces away from the one surface, and warped in a smile shape such that a warped edge portion of the semiconductor chip is inserted into the recess.

23 Claims, 4 Drawing Sheets

SEMICONDUCTOR PACKAGE

CROSS-REFERENCE TO RELATED APPLICATIONS

The present application claims priority to Korean patent application number 10-2010-0100740 filed on Oct. 15, 2010 and Korean patent application number 10-2011-0096144 filed on Sep. 23, 2011, which are incorporated herein by reference in their entireties.

BACKGROUND OF THE INVENTION

The present invention relates generally to a semiconductor package, and more particularly to a semiconductor package which is realized using the warpage of a semiconductor chip.

In general, a semiconductor chip in a semiconductor package is adhered to the upper surface of a substrate, which is electrically connected to the semiconductor chip by wires, and the upper surface of the substrate is sealed to cover the semiconductor chip and the wires.

In keeping with the modern semiconductor products requiring increasingly large capacity, a semiconductor chip with a larger capacity needs to be mounted in a semiconductor package. However, there limitations to increasing the capacity of a semiconductor chip itself. To achieve the desired large capacity, a stack type semiconductor package includes two or stacked semiconductor chips packaged therein.

Making the semiconductor chips thin helps to realize the high degree of integration of semiconductor packages; however, the semiconductor chips made thin tend to warp resembling a smile-shape, in which the edge portions of the semiconductor chip, for example, in a face-up structure with an active surface facing upward, warp upward.

When a semiconductor chip is warped with the edge portions bent upward, the warpage prevents the entire surface of the semiconductor chip from being attached to a substrate, and, when the chip surface is not securely attached to the substrate, it will cause difficulties in the subsequent wire bonding process. It may be impossible not only to stack semiconductor chips but also to perform a wire bonding process due to the warped semiconductor chips.

BRIEF SUMMARY OF THE INVENTION

An embodiment of the present invention is directed to a semiconductor package which can prevent inferior mounting of a semiconductor chip.

Also, an embodiment of the present invention is directed to a stack type semiconductor package which can prevent inferior mounting and can realize high density mounting of semiconductor chips.

In an embodiment of the present invention, a semiconductor package may includes: a substrate having an upper surface and a lower surface which faces away from the upper surface, and possessing a recess which is defined on the upper surface; and a semiconductor chip mounted to the upper surface of the substrate, having one surface which faces the upper surface and the other surface which faces away from the one surface, and warped in a smile shape such that a warped edge portion of the semiconductor chip is inserted into the recess.

Recesses may be defined at positions corresponding to both edge portions of the semiconductor chip, and the semiconductor chip may be mounted such that both the edge portions of the semiconductor chip are respectively inserted into corresponding recesses.

One recess may be defined at a position corresponding to one edge portion of the semiconductor chip, and the semiconductor chip may be mounted such that only the one edge portion of the semiconductor chip is inserted into the one recess.

The semiconductor package may further include an adhesive member interposed between the upper surface of the substrate and the one surface of the semiconductor chip.

The substrate may include bond fingers which are disposed on a surface exposed through the recess into which the edge portion of the semiconductor chip is inserted.

The semiconductor chip may include bonding pads which are formed on the edge portion to be inserted into the recess on the one surface, are disposed to face the bond fingers, and are electrically connected with the bond fingers.

The semiconductor chip may further include bumps which are formed on the bonding pads.

The semiconductor chip may include bonding pads formed on a middle portion of the one surface; and redistribution lines formed on the one surface, having one ends which are connected with the bonding pads and the other ends which extend from the one ends, are disposed to face the bond fingers and are electrically connected with the bond fingers.

The semiconductor chip may further include bumps formed on the other ends of the redistribution lines.

The substrate may include one or more additional recesses defined at regular intervals from the recess; and additional bond fingers disposed on surfaces exposed through the additional recesses.

The semiconductor package may further include one or more additional semiconductor chips mounted to the upper surface of the substrate to be separated from the semiconductor chip, and warped in a smile shape such that warped edge portions of the additional semiconductor chips are inserted into the additional recesses.

Each of the additional semiconductor chips may include additional bonding pads which are formed on the edge portion to be inserted into the additional recess, on the one surface, are disposed to face the additional bond fingers, and are electrically connected with the additional bond fingers.

Each of the additional semiconductor chips may further include additional bumps which are formed on the additional bonding pads.

The semiconductor package may further include additional adhesive members interposed between the semiconductor chip and an adjoining additional semiconductor chip and between the additional semiconductor chips.

The semiconductor package may further include an encapsulation member covering the semiconductor chip and the upper surface of the substrate; and external mounting members attached to the lower surface of the substrate.

In an embodiment of the present invention, a semiconductor package includes: a substrate having an upper surface and a lower surface which faces away from the upper surface, and possessing one or more additional recesses which are defined on the upper surface; a semiconductor chip mounted to the upper surface of the substrate, having one surface which faces the upper surface and the other surface which faces away from the one surface, and possessing a flat structure; and one or more additional semiconductor chips stacked over the semiconductor chip, and warped in a smile shape such that warped edge portions of the additional semiconductor chips are inserted into the additional recesses of the substrate.

The substrate may include bond fingers which are disposed on the upper surface having the semiconductor chip and the additional semiconductor chips disposed thereon and are electrically connected with the semiconductor chip, and additional bond fingers which are exposed through the additional recesses, and each of the additional semiconductor chips may include additional bonding pads which are disposed on the edge portion to be inserted into the additional recess and are electrically connected with the additional bond fingers.

The semiconductor package may further include additional bumps formed on the additional bonding pads.

The semiconductor package may further include an encapsulation member covering the semiconductor chip, the additional semiconductor chips and the upper surface of the substrate; and external mounting members attached to the lower surface of the substrate.

DESCRIPTION OF SPECIFIC EMBODIMENTS

Hereafter, specific embodiments of the present invention will be described in detail with reference to the accompanying drawings.

It is to be understood herein that the drawings are not necessarily to scale and in some instances proportions may have been exaggerated in order to more clearly depict certain features of the invention.

Figure 1:
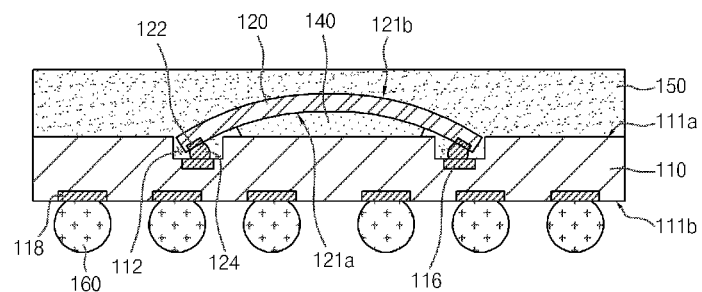
FIG. 1 is a cross-sectional view illustrating a semiconductor package in accordance with an embodiment of the present invention.
Figure 2:
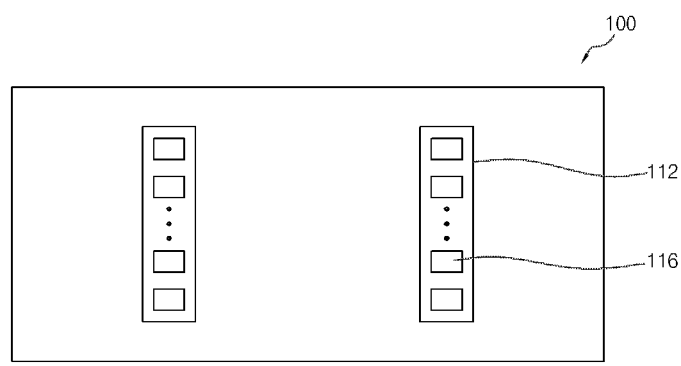
FIG. 2 is a plan view illustrating the substrate shown in FIG. 1.

FIG. 1 is a cross-sectional view illustrating a semiconductor package in accordance with an embodiment of the present invention, and FIG. 2 is a plan view illustrating the substrate shown in FIG. 1.

Referring to FIGS. 1 and 2, a semiconductor package 100 in accordance with an embodiment of the present invention includes a substrate 110, and a semiconductor chip 120 which is mounted to the substrate 110. Also, the semiconductor package 100 in accordance with an embodiment of the present invention further includes an adhesive component 140, an encapsulation component 150, and external mounting members 160.

The substrate 110 may be of, for example, a rectangular hexahedral shape and has an upper surface 111a and a lower surface 111b that are facing away from each other. The substrate 110 includes recesses 112 which are defined on the upper surface 111a, bond fingers 116 which are disposed on the upper surface 111a and are exposed through the recesses 112, and ball lands 118 which are disposed on the lower surface 111b and are electrically connected to the respective bond fingers 116. As shown in FIG. 1, the bond fingers 116 may be disposed on the bottom surfaces of the recesses 112. Alternatively, while not shown in the drawing, the bond fingers 116 may be disposed on the sidewall surfaces of the recesses 112.

The drawings of the present application show the recesses (such as 112 in FIG. 1) in a rectangular cross-sectional shape and also show the bond fingers (such as 116 in FIG. 1) as being disposed on the bottom (or sidewall) surfaces of the cross-sectionally rectangular recesses (such as 112 in FIG. 1). However, other geometric cross-sectional shapes and various forms of bonding arrangements are possible according to an embodiment of the present invention. For example, the recesses such as 112 shown in FIG. 1 may have open trapezoidal cross-sectional shape with sloped surfaces, and the bond fingers 116 may be disposed on the inclined surfaces of the recesses 112.

The semiconductor chip 120 has one surface 121a which faces the upper surface 111a of the substrate 110 and the other surface 121b which faces away from the surface 121a. Also, the semiconductor chip 120 includes bonding pads 122 which are disposed on the surface 121a and bumps 124 which are formed on the bonding pads 122. The bumps 124 may include various conductive materials, for example, solder bumps or gold stud bumps. Since the semiconductor chip 120 is manufactured to be thin, the semiconductor chip 120 has a structure in which the edge portions of the semiconductor chip 120 are warped upward, that is, a structure in which the warpage occurred in a smile shape. The surfaces 121a, 121b of the semiconductor chip 120 will be also referred to as the inner warped surface 121a and the outer warped surface 121b The warped semiconductor chip 120 is mounted to the upper surface 111a of the substrate 110 face-down such that the inner warped surface 121a faces the upper surface 111a of the substrate 110.

Then, the warped edge portions of the semiconductor chip 120 are inserted into the recesses 112 of the substrate 110, and the bonding pads 122 of the semiconductor chip 120 are electrically connected to the corresponding bond fingers 116 in the recesses 112. The bonding pads 122, which, for example, are disposed on the warped edge portions of the semiconductor chip 120 are inserted into the recesses 112 of the substrate 110. As shown in FIG. 1, the bonding pads 122 of the semiconductor chip 120 and the bond fingers 116 of the substrate 110 are electrically connected to each other by the bumps 124 which are formed on the bonding pads 122.

Although FIG. 1 shows a bump 124 by which the bonding pad 122 and the bonding finger 116 are brought into contact, the bonding pad 122 the bonding finger 116 can be electrically connected to each other through various different ways. For example, while not shown in a drawing, the bonding pad 122 of the semiconductor chip 120 and the bond finger 116 of the substrate 110 may be electrically connected to each other by being brought into a direct contact with each other without using a separate connection member.

Also, while not shown in a drawing, the bonding pad 122 of the semiconductor chip 120 and the bond finger 116 of the substrate 110 may be electrically connected to each other not by the bumps but by a conductive paste which is filled in the recess 112. That is, a warped edge portion of the semiconductor chip 120 on which a bonding pad 122 is disposed may be inserted into a recess 112 of the substrate 110 with no bump formed on the bonding pad 122 therein, and the bonding pad 122 of the semiconductor chip 120 and the bond finger 116 of the substrate 110 may be electrically connected to each other by the conductive paste in the recess 112.

In accordance with an embodiment of the present invention, the recesses 112 are defined on the portions of the upper surface 111a of the substrate 110 which correspond to both the edge portions of the semiconductor chip 120, and as such the warped edge portions of the semiconductor chip 120, on which the bonding pads 122 are disposed, are insertable into the corresponding recesses 112.

The adhesive component 140 is applied between the upper surface 111a of the substrate 110 and the inner warped surface 121a of the semiconductor chip 120. The adhesive component 140 acts to securely attach the semiconductor chip 120 to the upper substrate surface 111a providing solid physical attachment. The adhesive component 140 also acts to prevent the further warpage from occurring in the already warped semiconductor chip 120.

The encapsulation component 150 is formed to cover the semiconductor chip 120 and the upper surface 110a of the substrate 110. The encapsulation component 150 may include, for example, an epoxy molding compound (EMC).

The external mounting members 160 are attached to the ball lands 118 which are disposed on the lower substrate surface 111b. The external mounting members 160 may include, for example, solder balls.

In general, a semiconductor chip with reduced thickness such as 120 in FIG. 1 is warped in an arcuate cross-sectional profile (e.g., in a smile-shape). As described above, by mounting the warped semiconductor chip 120 to the upper substrate surface 111a with the inner warped surface 121a facing toward the upper substrate surface 111a and by inserting the warped edge portions of the semiconductor chip 120 into the recesses 112 defined on the upper substrate surface 111a, the difficulties related to securely attaching a warped chip to a substrate can be overcome.

In other words, in an embodiment of the present invention, the inner warped surface 121a of the warped semiconductor chip 120 is attached to the substrate 110 by the medium of the adhesive component 140, and the warped edge portions of the semiconductor chip 120 (where the bonding pads 122 are formed on the inner warped surface 121a) are inserted into the recesses 112 formed on the upper substrate surface 111a. Thus, by having the edge portions secured in the recesses 112 on the upper substrate surface 111a, it is possible to originally the edge portions of the semiconductor chip 120 from warping away from the substrate 110, and as a consequence, the mounting reliability of the semiconductor package 100 is improved.

Figure 3:
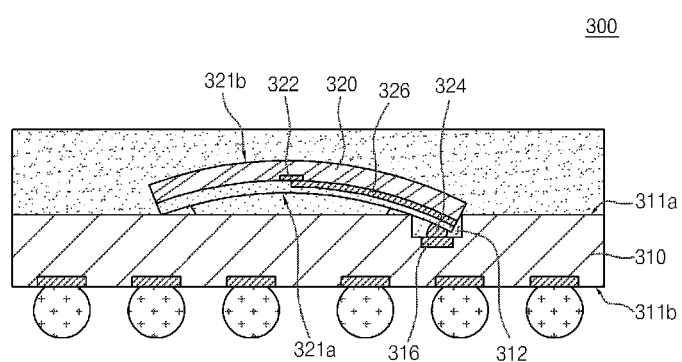
FIG. 3 is a cross-sectional view illustrating a semiconductor package in accordance with another embodiment of the present invention.
Figure 4:
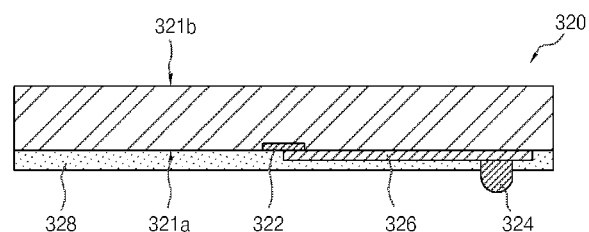
FIG. 4 is a cross-sectional view illustrating the semiconductor chip shown in FIG. 3.

FIG. 3 is a cross-sectional view illustrating a semiconductor package 300 in accordance with another embodiment of the present invention, and FIG. 4 is a cross-sectional view illustrating the semiconductor chip 320 shown in FIG. 3. With regard to FIGS. 3-4, there are features that are similar to those shown in FIGS. 1-2 described above and as such the similar features are not repetitively described.

In accordance with an embodiment of the present invention as shown in FIG. 3, a recess 312 is formed on a portion of an upper surface 311a of a substrate 310 in the semiconductor package 300. The recess 312 is formed to accommodate therein an edge portion of the semiconductor chip 320. In an embodiment as shown in FIGS. 1-2, two edge portions of the warped semiconductor chip 120 are accommodated in two rows of recesses 112 formed on the upper substrate surface 111a of the substrate 110. However, in an embodiment of the present invention as shown in FIGS. 3-4, only one edge portion of the semiconductor chip 320 is formed with the bonding pads 322 on the inner warped surface 321a of the semiconductor chip 320, and that edge portion is inserted into the recess 312.

In accordance with an embodiment of the present invention as shown in FIGS. 3-4, the semiconductor chip 320 is formed with bonding pads 322 that are formed on a middle portion of the inner warped surface 321a of the semiconductor chip 320. Redistribution lines 326 are formed on the inner surface 321a as shown in FIG. 4, and each redistribution line 326 connects one of the bonding pads 322 to a bump 324 formed on the inner surface 321a at the edge portion of the warped semiconductor chip 320. A dielectric layer 328 is formed to cover the redistribution lines 326 on the surface 321a while exposing the bumps 324 at the edge portion of the semiconductor chip 320.

The semiconductor chip 320 is thus electrically connected to the substrate 310 by one edge portion of the warped semiconductor chip 320 (where the ends of the redistribution lines 326 are disposed) is inserted into the recess 312. The ends of the redistribution lines 326 at the edge portion of the semiconductor chip 320 are therefore also inserted into the recess 312 and are coupled to the bond fingers 316 which are formed on the bottom surface of the recess 312.

Whereas, in FIGS. 3-4, the bonding pads are formed at the edge portion and at the middle portion of the semiconductor chip 320, it is possible that the semiconductor chip 320 may be a "one side chip" in which the bonding pads 322 are formed only at the one edge portion and on the inner surface 321a of the semiconductor chip 320.

Also, according to an embodiment of the present invention, it is also possible that the redistribution lines 326 may extend to any other edge portions other than those shown in FIGS. 3-4. For example, it is possible and within the scope of the present invention that the redistribution lines 326 my extend to the other edge portion of the semiconductor chip 320 on the opposite side of the edge portion shown in FIG. 3. In this case, then, the semiconductor chip 320 may be mounted in such a manner that the recesses are defined in the substrate 310 at the positions on the other side of the recesses 312 that are presently shown in FIG. 3. The ends of the redistribution lines 326 extending from a middle portion of the semiconductor chip 320 to the edge portion on the opposite side of the edge portion as shown in FIG. 3 would be inserted into the corresponding recesses that are formed on the opposite side of the recesses 312 presently shown in FIG. 3.

The bonding pads 322 of the semiconductor chip 320 and the bond fingers 312 of the substrate 310 may be electrically connected to each other by bumps 324 which are formed at the edge portion on the distribution line 326. In FIGS. 3-4, the bonding pads 322 are shown in the middle portion of the semiconductor chip 320 according to an embodiment of the present invention; however, the scope of the present invention is not limited thereto. The bonding pads 322 may be formed in the locations other than the middle portion shown in FIGS. 3-4 that may be better suited for layout of the distribution line 326.

Further, according to an embodiment of the present invention, it is possible that the bonding pads 322 of the semiconductor chip 320 and the bond fingers 316 of the substrate 310 may be electrically connected to each other by a direct contact without needing the connection members therebetween. In addition, according to an embodiment of the present invention, it is also possible that conductive pastes, which are filled in the recess 312, may be used instead of the bumps 324 to electrically connect the bonding pads 322 of the semiconductor chip 320 and the bond fingers 316 of the substrate 310.

In accordance with an embodiment of the present invention, the warped semiconductor chip 320 is mounted to the substrate 310 with the recess 312 with the inner warped surface 321a facing the upper surface 311a of the substrate 310 such that the edge portion of the semiconductor chip 320 where the bumps 324 are formed according to an embodiment of the present invention is inserted into the recess 312 formed on the upper surface 311a of the substrate 310, whereby the mounting reliability of the semiconductor package 300 is improved.

Figure 5:
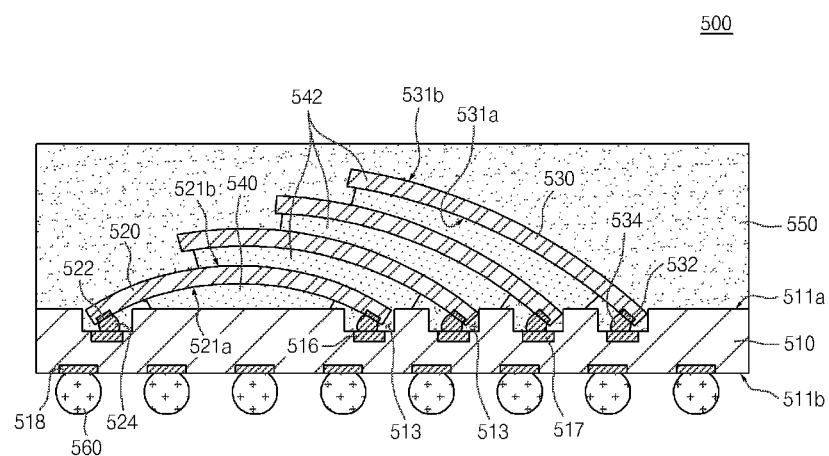
FIG. 5 is a cross-sectional view illustrating a stack type semiconductor package in accordance with another embodiment of the present invention.
Figure 6:
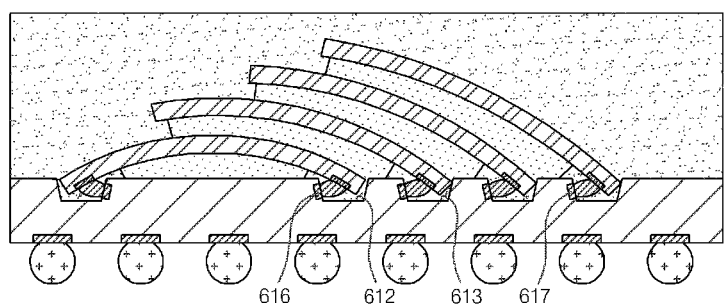
FIG. 6 is a cross-sectional view illustrating a stack type semiconductor package in accordance with another embodiment of the present invention.

FIGS. 5-6 are cross-sectional views for showing different variations of the semiconductor package in accordance with an embodiment of the present invention.

Referring to FIG. 5, a stack type semiconductor package 500 in accordance with an embodiment of the present invention includes one or more semiconductor chip 520 and one or more semiconductor chips 530 over a substrate 510. The semiconductor package 500 includes adhesive components 540 and 542, an encapsulation component 550, and external mounting members 560.

The upper and lower surfaces 511a and 511b are on the opposite sides of each other, and the recesses such as 512 and 513 are formed on the upper surface 511a as shown in FIG. 5. The bond fingers such as 516 and 517 are formed on the portions of the upper surface 511a of the substrate 510 so as to be exposed through the recesses such as 512 and 513, and ball lands 518 are formed on the lower surface 511b.

The bond fingers such as 516 and 517 may be disposed on the surfaces of the recesses 512 and 513 such as the bottom surfaces as shown in FIG. 5. Thus, for example, it is also possible that the bond fingers 516 and 517 may be formed on the sidewall surfaces of the recesses 512 and 513 according to an embodiment of the present invention.

Although the recesses 512 and 513 are shown in FIG. 5 as being the rectangular cross-sectional shape, but the scope of the present invention is limited to this and other shapes are possible. For example, as shown in FIG. 6, recesses 612 and 613 may be formed to have a trapezoidal cross-sectional shape. The sidewall surfaces of the recesses 612 and 613 having the trapezoidal cross-sectional shape would have the sloped surfaces, and the bond fingers 616 and 617 may be formed on any surfaces of the recesses 612 and 613 including the sloped sidewall surfaces as shown in FIG. 6 so as to be exposed through the recesses 612 and 613.

Referring back to FIG. 5, the semiconductor chip 520 has the inner warped surface 521a which faces the upper surface 511a of the substrate 510 and the outer warped surface 521b which is on the opposite side the inner warped surface 521a of the semiconductor chip 520. The semiconductor chip 520 includes bonding pads 522, which are formed on two edge portions on the inner warped surface 521a, and bumps 524, which are formed on the bonding pads 522. The bumps 524 may be of, for example, solder bumps or gold stud bumps. The semiconductor chip 520, when manufactured thin, may warp to resemble a smile shape as shown in FIG. 5.

Both of the two edge portions of the semiconductor chip 520 are inserted into the two rows of the recesses 512 of the substrate 510, and the bonding pads 522 of the semiconductor chip 520 and the bond fingers 516 of the substrate 510 are electrically connected to each other by the bumps 524 formed on the bonding pads 522 in the recesses 512.

Accordingly, the recesses 512 (e.g., FIG. 5 shows two rows of the recesses 512 into which the two edge portions of the chip 520 are inserted thereto) is formed to respectively correspond to the two edge portions of the semiconductor chip 520, and the semiconductor chip 520 is mounted such that the two edge portions thereof are respectively inserted into the recesses 512.

FIG. 5 shows the semiconductor chip 520 being mounted on the substrate 510 with the two edge portions of the semiconductor chip 520 inserted into the recesses 512 of the substrate 510. However, according to an embodiment of the present invention, it should be readily understood that the semiconductor chip 520 may be of a one-side pad type chip such that only one edge portion of the semiconductor chip 520 is inserted into the recess 512 of the substrate 510 for mounting on the substrate 510. In this case, the one-side pad type semiconductor chip 520 may, for example, have the bonding pads that are disposed only on one edge portion or be of a center pad type chip which has redistribution lines.

One of the semiconductor chips 530 also shown in FIG. 6 (along with the semiconductor chip 520) has the inner warped surface 531a facing the outer warped surface 521b of the semiconductor chip 520. Each semiconductor chip 530 has the outer warped surface 531b which faces away from the inner warped surface 531a. One semiconductor chip 530 is mounted over the outer warped surface 521b of the semiconductor chip 520. The additional semiconductor chips 530 are formed so that each chip 530 is formed over the outer warped surface 531 of another semiconductor chip 530 as shown in FIG. 5. The semiconductor chips 520 and 530 as shown in FIG. 5 are warped in a shape resembling a smile as they were manufacture thin. The bonding pads 532 and the additional bumps 534 are formed on the semiconductor chips 530 along only one edge portion of each semiconductor chip 530. Each of the semiconductor chips 530 is mounted such that only one edge portion, on which the bonding pad 532 and the additional bump 534 are formed, is inserted into the recess 513, which is defined on the upper surface 511a of the substrate 510.

Each of the semiconductor chips 530 may be a one-side pad type chip in which the bonding pads 532 are formed only on one edge portion or a center pad type chip having the redistribution lines.

The adhesive component 540 is interposed between the upper surface 511a of the substrate 510 and the outer warped surface 521a of the semiconductor chip 520. The adhesive component 540 functions to physically secure the semiconductor chip 520 inserted into the two rows of recesses 512 onto the upper surface 511a of the substrate 510, thereby overcoming the physical characteristics of the warped the semiconductor chip 520. The adhesive component 540 also prevents the semiconductor chip 520 from being further bent out of shape due to the warpage.

The adhesive components 542 are interposed between the semiconductor chip 520 and one of the semiconductor chip 530 placed nearest to the outer warped surface 521b of the semiconductor chip 520 and between the outer warped surface 531b of one chip 530 and the inner warped surface 531a of the another semiconductor chip 530. The additional adhesive component 542 physically secures the semiconductor chip 520 and the lowermost semiconductor chip 530 to each other and secures the other semiconductor chips 530 that are inserted into the recesses 513 to each other.

The encapsulation component 550 is formed to encapsulate the semiconductor chips 520, 530 and the upper surface 511a of the substrate 510. The encapsulation component 550 may include, for example, an epoxy molding compound (EMC).

The external mounting members 560 are attached to the ball lands 518 which are disposed on the lower surface 511b of the substrate 510. The external mounting members 560 may include, for example, solder balls.

In a stack type semiconductor package in accordance an embodiment of the present invention as described above, the warped semiconductor chips are mounted on the substrates in a face-down manner (that is, the inner warped surface such as 121a, 321a, 521a, 531a as shown in FIGS. 1-6 are mounted to face the respective upper surfaces of the corresponding substrates), so as to prevent the semiconductor chips from warping away from the respective substrates (for example, warping upwardly from the upper surface 111a of the substrate 110 as in FIG. 1). That is, according to an embodiment of the present invention, the thin but warped semiconductor chips are mounted on the substrate having the recesses in a face-down manner, which is as described above and as shown in FIGS. 1-6, it is possible to realize a miniaturized semiconductor package of high integration and of improved mounting reliability.

Figure 7:
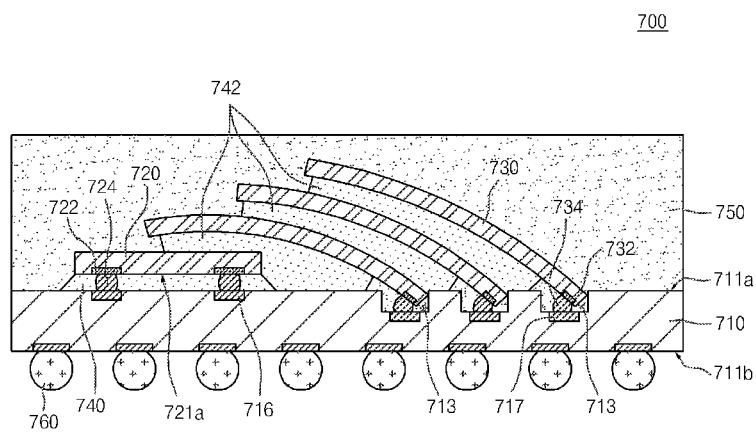
FIG. 7 is a cross-sectional view illustrating a stack type semiconductor package in accordance with another embodiment of the present invention.

FIG. 7 is a cross-sectional view showing another variation of a semiconductor package in accordance with an embodiment of the present invention. With regard to FIG. 7, the similar features shown in and described with respect to FIGS. 1-6 may not be repeated below.

Referring to FIG. 7, a stack type semiconductor package 700 includes a substrate 710, and a semiconductor chip 720 and one or more additional semiconductor chips 730 which are mounted to the substrate 710. Also, the stack type semiconductor package 700 further includes an adhesive component 742, an encapsulation component 750 and external mounting members 760.

In particular, in the semiconductor package 700 in accordance with an embodiment of the invention as shown in FIG. 7, include the semiconductor chip 720, which is not warped, unlike the semiconductor chips shown in FIGS. 1, 3, and 5-6. The semiconductor chip 720 includes bonding pads 722 which are formed on two edge portions, and bumps 724 which are formed on the bonding pads 722.

The semiconductor chip 720 and the warped semiconductor chips 730 are mounted on an upper surface 711a of the substrate 710, and a lower surface 711b faces away from the upper surface 711a. In an embodiment of the present invention as shown in FIG. 7, the substrate 710 is formed with recesses 713 to accommodate therein the edge portions of the warped semiconductor chips 730 but may not be formed with recesses for the semiconductor chip 720, which is not warped. The substrate 710 includes bond fingers 716 formed on the portions of the upper surface 711a to correspond with the bonding pads 722 of the semiconductor chip 720. One or more bond fingers 717 are formed on a surface of the recesses 713 (such as the bottom surface as shown in FIG. 7) so as to be exposed through the recesses 713.

Accordingly, the bonding pads 722 of the semiconductor chip 720 and the bond fingers 716 of the substrate 710 are electrically connected to each other by the bumps 724, and the bonding pads 732 of the warped semiconductor chips 730 and the bond fingers 717 in the recesses 713 of the substrate 710 are electrically connected to each other by bumps 734 formed on the bonding pads 732. The bond fingers 717 are formed on the bottom surfaces of the recesses 713 according to an embodiment as shown in FIG. 7, but it should be readily understood that the bond fingers may be formed on other surfaces such as the sidewall surfaces of the recesses 713.

The warped semiconductor chips 730 are mounted such that one edge portion of each semiconductor chip 730 having the bonding pad 732 and the bump 734 formed thereon is inserted into one of the recesses 713 defined on the upper surface 711a of the substrate 710. Each of the semiconductor chips 730 may be a one-side pad type chip in which a bonding pad 732 is formed only on one edge portion or a center pad type chip having the redistribution lines.

The bonding pads 722 of the semiconductor chip 720 and the bond fingers 716 of the substrate 710 are electrically connected to each other by the bumps 724 formed on the bonding pads 722, and the bonding pads 732 of the warped semiconductor chips 730 and the bond fingers 717 of the substrate 710 are electrically connected to each other by the bumps 734, which are formed on the bonding pads 732. The bonding pads 722 of the semiconductor chip 720 and the bond fingers 716 of the substrate 710 may be electrically connected to each other by a direct contact without needing separate connection members, and the additional bonding pads 732 of the warped semiconductor chips 730 and the bond fingers 717 of the substrate 710 may be electrically connected to each other by a direct contact without requiring separate connection members. In addition, the bonding pads 732 of the warped semiconductor chips 730 and the bond fingers 717 of the substrate 710 may be electrically connected to each other by conductive pastes which are filled in the additional recesses 717.

Figure 8:
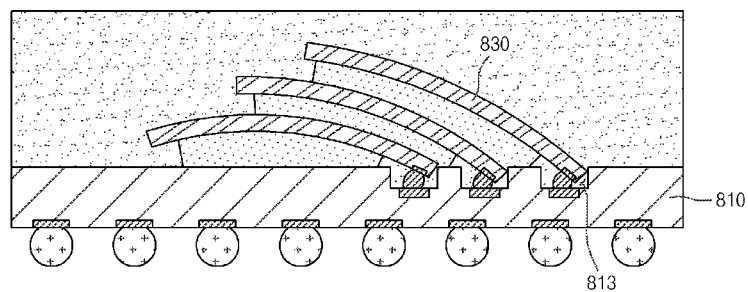
FIG. 8 is a cross-sectional view illustrating a stack type semiconductor package in accordance with another embodiment of the present invention.

Now referring to FIG. 8, it is also noted that all of the semiconductor chips 830 may be of a one-side pad type chip such that only one edge portion of the semiconductor chip 830 is inserted into the recess 813 of the substrate 810 for mounting on the substrate 810. In this case, the one-side pad type semiconductor chip 830 may, for example, have the bonding pads that are disposed only on one edge portion or be of a center pad type chip which has redistribution lines.

It should be readily understood that the semiconductor chips of different lengths may be packaged according to an embodiment of the present invention.

Although various embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor package comprising:
   a substrate comprising a first recess formed in an upper surface of the substrate; and
   a first warped semiconductor chip having an inner warped surface and an outer warped surface facing away from the inner warped surface, and mounted on the upper surface of the substrate such that a first edge portion of the inner warped surface is inserted into the first recess formed in the upper surface of the substrate, wherein the inner warped surface except the first edge portion is outside of the first recess.

2. The semiconductor package according to claim 1,
   wherein the first warped semiconductor chip comprises a second edge portion of the inner warped surface facing away from the first edge portion, and inserted into a second recess formed in the upper surface of the substrate, and
   wherein the first warped semiconductor chip is mounted such that the first and second edge portions are respectively inserted into the first and second recesses.

3. The semiconductor package according to claim 2, further comprising:
   an adhesive component in between the upper surface of the substrate and the inner warped surface of the first warped semiconductor chip.

4. The semiconductor package according to claim 2, wherein the substrate comprises a bond finger formed on a surface of each of the first and second recesses.

5. The semiconductor package according to claim 4, wherein the first warped semiconductor chip comprises first and second bonding pads formed on each of the first and second edge portions to electrically connect with the bond finger formed on a surface of each of the first and second recesses.

6. The semiconductor package according to claim 5, wherein the first warped semiconductor chip further includes a bump formed on each of the bonding pads.

7. The semiconductor package according to claim 4, wherein one or more of the recess is formed in a rectangular cross-sectional shape and wherein the bonding finger in each recess is formed on the bottom or side surface of the recess.

8. The semiconductor package according to claim 4, wherein one or more of the recess is formed in a trapezoidal cross-sectional shape and wherein the bonding finger in each recess is formed on the bottom or side surface of the recess.

9. The semiconductor package according to claim 2, further comprising a second warped semiconductor chip having an inner warped surface and an outer warped surface facing away from the inner warped surface of the second warped semiconductor chip, and mounted on the upper surface of the substrate such that a third edge portion of the inner warped surface of the second warped semiconductor chip is inserted into a third recess formed in the upper surface of the substrate.

10. The semiconductor package according to claim 9, further comprising:
an adhesive component in between the first and second warped semiconductor chips.

11. The semiconductor package according to claim 10, wherein the second warped semiconductor chip comprises an end bonding pad formed on the third edge portion.

12. The semiconductor package according to claim 11, wherein the second warped semiconductor chip comprises:
a middle bonding pad formed on a middle portion of the inner warped surface of the second warped semiconductor chip; and
a redistribution line formed on the inner warped surface of the second warped second semiconductor chip to electrically connect the middle and end bonding pads.

13. The semiconductor package according to claim 12, wherein the substrate comprises a bond finger formed on a surface of the third recess to electrically connect with the end bonding pad formed on the third edge portion.

14. The semiconductor package according to claim 13, wherein the second semiconductor chip further includes a bump formed on of the end bonding pad.

15. The semiconductor package according to claim 13, wherein the third recess is formed in a rectangular cross-sectional shape and wherein the bonding finger in the third recess is formed on the bottom or side surface of the third recess.

16. The semiconductor package according to claim 13, wherein the third recess is formed in a trapezoidal cross-sectional shape and wherein the bonding finger in the third recess is formed on the bottom or side surface of the third recess.

17. The semiconductor package according to claim 12, wherein the second warped semiconductor chip further comprises:
a bump formed on one end of the redistribution line corresponding to the third edge portion.

18. The semiconductor package according to claim 17, wherein the redistribution line is covered with a protective material while exposing the bump.

19. The semiconductor package according to claim 1, further comprising:
an encapsulation member covering the first warped semiconductor chip and the upper surface of the substrate; and
external mounting members attached to the lower surface of the substrate.

20. The semiconductor package according to claim 5, wherein the first warped semiconductor chip comprises:
a middle bonding pad formed on a middle portion of the inner warped surface of the first warped semiconductor chip; and
a redistribution line formed on the inner warped surface of the first warped second semiconductor chip to electrically connect the middle and first bonding pads of the first warped semiconductor chip.

21. The semiconductor package according to claim 20, further comprising a fourth warped semiconductor chip having an inner warped surface and an outer warped surface facing away from the inner warped surface of the fourth warped semiconductor chip, and mounted on the upper surface of the substrate such that a forth edge portion of the inner warped surface of the fourth warped semiconductor chip is inserted into a fourth recess formed in the upper surface of the substrate, wherein the inner warped surface of the forth warped semiconductor device except the forth edge portion is outside of the forth recess.

22. The semiconductor package according to claim 21, further comprising an adhesive component is in between the first and fourth warped semiconductor chips.

23. The semiconductor package according to claim 19, further comprising a fifth non-warped semiconductor chip formed below the first warped semiconductor chip, and attached to the first warped semiconductor chip by the medium of an adhesive component.

* * * * *